(12) United States Patent  (10) Patent No.: US 7,494,924 B2
Shiu et al.  (45) Date of Patent: Feb. 24, 2009

(54) METHOD FOR FORMING REINFORCED INTERCONNECTS ON A SUBSTRATE

(75) Inventors: Hei Ming Shiu, Tsuen Wan (HK); On Lok Chau, Ma On Shan (HK); Gor Amie Lai, Tseung Kwan (HK); Heng Keong Yip, Selangor Darul Ehsan (MY); Thoon Khin Chang, Jalan Cheras (MY); Lan Chu Tan, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 346 days.

(21) Appl. No.: 11/370,387

(22) Filed: Mar. 6, 2006

(65) Prior Publication Data

US 2007/0207605 A1 Sep. 6, 2007

(51) Int. Cl.
*H01L 21/44* (2006.01)
(52) U.S. Cl. ................ 438/666; 438/107; 438/108; 438/652; 438/668
(58) Field of Classification Search ......... 438/107–108, 438/652, 666, 668
See application file for complete search history.

(56) References Cited

U.S. PATENT DOCUMENTS

| | | | |
|---|---|---|---|
| 4,705,205 A | 11/1987 | Allen et al. | |
| 6,252,175 B1 * | 6/2001 | Khandros | 174/250 |
| 6,281,607 B1 | 8/2001 | Petach et al. | |
| 6,578,754 B1 | 6/2003 | Tung | |
| 2001/0004944 A1 * | 6/2001 | Nakamura et al. | 174/262 |
| 2002/0076971 A1 * | 6/2002 | Khoury et al. | 439/418 |
| 2002/0117330 A1 * | 8/2002 | Eldridge et al. | 174/260 |
| 2003/0234451 A1 * | 12/2003 | Razon | 257/773 |
| 2004/0134974 A1 * | 7/2004 | Oh et al. | 228/245 |
| 2005/0073334 A1 * | 4/2005 | Farnworth et al. | 324/765 |
| 2005/0077624 A1 | 4/2005 | Tan et al. | |
| 2005/0090091 A1 | 4/2005 | Ishikawa et al. | |
| 2005/0110164 A1 | 5/2005 | Pendse | |
| 2005/0133928 A1 * | 6/2005 | Howard et al. | 257/773 |

FOREIGN PATENT DOCUMENTS

JP 05166811 A 7/1993

* cited by examiner

*Primary Examiner*—Zandra Smith
*Assistant Examiner*—Bac H Au
(74) *Attorney, Agent, or Firm*—Charles Bergere

(57) ABSTRACT

A method for forming reinforced interconnects or bumps on a substrate includes first forming a support structure on the substrate. A substantially filled capsule is then formed around the support structure to form an interconnect. The interconnect can reach a height of up to 300 microns.

9 Claims, 3 Drawing Sheets

METHOD FOR FORMING REINFORCED INTERCONNECTS ON A SUBSTRATE

BACKGROUND OF THE INVENTION

The present invention relates to a method for forming interconnects on a semiconductor wafer or printed circuit board (PCB). More particularly, the present invention relates to a method for forming reinforced interconnects having a support structure therein to achieve a high stand-off.

Development of microelectronics packaging has been continually driven by the quest to reduce costs and achieve higher packaging density and improved performance while still maintaining or even improving circuit reliability. To meet these ends, a flip-chip bonding process, where a semiconductor chip is assembled face down on a substrate or circuit board, has become a popular choice in microelectronics packaging. Flip-chip bonding is advantageous because the space normally required for bump or connections within the chip is eliminated. In addition, flip-chips generally provide superior performance in high frequency applications.

A flip-chip assembly is typically fabricated in three stages: forming interconnects or bumps on a chip, attaching the bumped chip to a board or substrate, and filling the space remaining under the bumped chip with an electrically non-conductive material. There are many conventional methods of forming interconnects on a semiconductor wafer. One method includes forming a gold stud bump on a substrate with a wire bonder and forming a second stud bump thereon with solder to increase the interconnect stand-off.

Although in theory, additional stud bumps may be stacked in succession to obtain a high stand-off, the process is problematic. Firstly, the top surface of each stud bump is unlikely to be flat, thus making stacking difficult. Secondly, if a stud bump is formed over three or more stacked bumps, it is likely to collapse during formation. Therefore, the maximum number of stud bumps is limited and the stand-off height restricted to about 60 microns. With a low stand-off of about 60 microns, the bump is prone to shear strain arising from a mismatch in coefficients of thermal expansion (CTE) between the semiconductor chip and the wafer substrate. Excessive strain can cause bump fracture resulting in failure of the flip chip assembly.

Another method of forming interconnects involves providing an elongated pillar with a total stand-off height in the range of 80 to 120 microns formed from two elongated pillars. This method begins by first forming a layer of photo-resist on a flip-chip. Portions of the photo-resist layer may then be irradiated to form through holes in the layer. The holes are separately filled with copper followed by a solder to form an elongated pillar.

To fill the holes, the entire structure may first be placed in a copper bath and electroplated to deposit copper in the holes. Subsequently, the entire structure may be placed in a solder bath and electroplated to fill the remaining space in the holes with solder. The photo-resist layer is then removed by chemical baths to expose the elongated pillar. Reflow of the elongated pillar can then be carried out to connect the flip chip to a substrate.

Unfortunately, this process for forming interconnects is expensive and involves numerous chemical solutions, which generate chemical wastes. Another problem is that the stand-off of the pillar is limited by the thickness of the photo-resist layer. Although thickness of the photo-resist layer can be increased, doing so limits the pitch of the pillar. In practice, the openings in the photo-resist layer typically have a reverse conical shape, i.e., the openings taper towards a narrow end at the bond pads. Therefore, if a fine pitch is desired, the thickness of the photo-resist layer may be limited to about 80 microns. Hence, there is a tradeoff between a high stand-off and a fine pitch.

In view of the foregoing, it would be desirable to have a method for forming interconnects that is low cost and does not involve wet chemicals. In addition, it would be desirable to have a method that provides high stand-off and fine pitch.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE INVENTION

Methods for forming elongated interconnects or bumps on a substrate in a semiconductor chip or printed circuit board (PCB) environment are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail to not unnecessarily obscure the present invention.

In one embodiment, the present invention is a method of forming a conductive bump, including the steps of forming a support structure on a substrate; attaching solder to the support structure; and melting the solder to form the conductive bump. The support structure comprises one or more wire loops formed with a wire bonding process. The solder can be attached by depositing an adhesive on the support structure and then depositing solder on the adhesive. Alternatively, the solder can be attached by dipping the support structure into molten solder bath.

Figure 1:
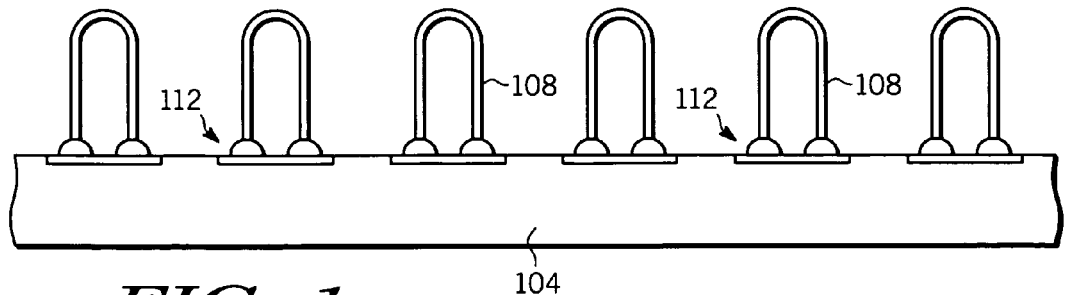
FIG. 1 illustrates an enlarged cross-sectional view of a semiconductor wafer in accordance with an embodiment of the present invention.

Referring now to FIG. 1, an enlarged cross-sectional view of a semiconductor wafer 104 or substrate in accordance with a first embodiment of the present invention is shown. A support structure 108 is formed on the substrate 104 by, for example, a wire bonding machine. The wires may be bonded onto bond pads 112 of the substrate 104 or onto thermal stand-offs. The material for the support structures 108 may be chosen from gold, copper or any alloy that is solderable. In one embodiment, the support structures comprise copper wires.

In this particular embodiment, the support structure 108 is formed by a single wire loop. This support structure 108 is generally suitable for forming interconnects having a small cross-sectional area. If a larger cross-section or a more voluminous interconnect is desired, other configurations of the present invention such as the embodiment illustrated in FIG. 6A may be utilized.

The height of the support structures 108 may be in the range of about 150 microns to about 300 microns, subject to the capabilities of the wire bonding machine. Most wire bonding machines can provide a stand-off height of up to 300 microns, which is advantageous for flip chip applications.

Flip chip assemblies typically experience coefficient of thermal expansion (CTE) mismatch between silicon (CTE about 2 to 4 parts per million per degrees Celsius or PPM/° C.) and ceramic substrate (CTE about 6 to 7 PPM/° C.), or between silicon and typical circuit boards (CTE about 12 to 18 PPM/° C.). Because of the CTE mismatch, the interconnects are subject to thermal fatigue during temperature cycling of the fabrication process or during normal use of the flip chip device. Excessive thermal stress may result in fracture of the interconnect, and/or delamination or cracking of the semiconductor chip, which eventually leads to device failure.

The incidence of fractures is notably higher in devices that use low-K (dielectric constant) materials, which have a low mechanical and cohesive strength. This is important because the use of low-K materials for semiconductor fabrication is growing rapidly. As the magnitude of thermal stresses depends on the CTE mismatch between the materials and the length-height ratio of the interconnect, the stand-off height of the interconnect must be increased to withstand large temperature fluctuations and CTE mismatch. The range of stand-offs provided by the present invention is therefore advantageous in improving reliability of the interconnects.

Figure 2:
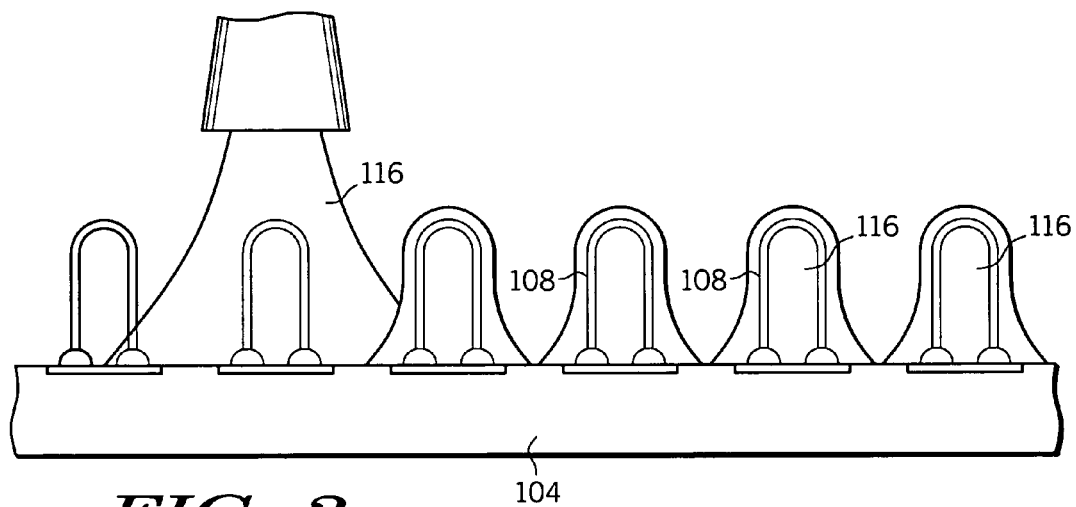
FIG. 2 illustrates an enlarged cross-sectional view of the semiconductor wafer of FIG. 1 receiving an adhesive in accordance with an embodiment of the present invention.

Referring now to FIG. 2, an enlarged cross-sectional view of the substrate 104 receiving an adhesive 116 in accordance with an embodiment of the present invention is shown. An adhesive 116 may be deposited by dispensing it directly onto the support structure 108 or by dipping the support structure 108 into an adhesive bath. Suitable adhesives may include a flux, such as, tin-lead solder flux, water soluble flux and no-clean flux. It should be appreciated that flux improves wetting and bonding abilities of solder. In addition, flux may be used to remove contaminants and oxidation from the surface of the bond pads 112 and/or support structure 108.

However, flux may not be required if the support structure 108 is freshly prepared and therefore substantially free of oxidation. If application of a flux is not required, the support structure 108 may be dipped into a molten solder bath to coat the support structure 108 with solder. The coated support structure 108 may then be removed from the solder bath and the molten solder allowed to solidify. In this manner, the solidified solder forms an interconnect, one embodiment of which is a substantially filled capsule around the support structure 108.

Figure 3:
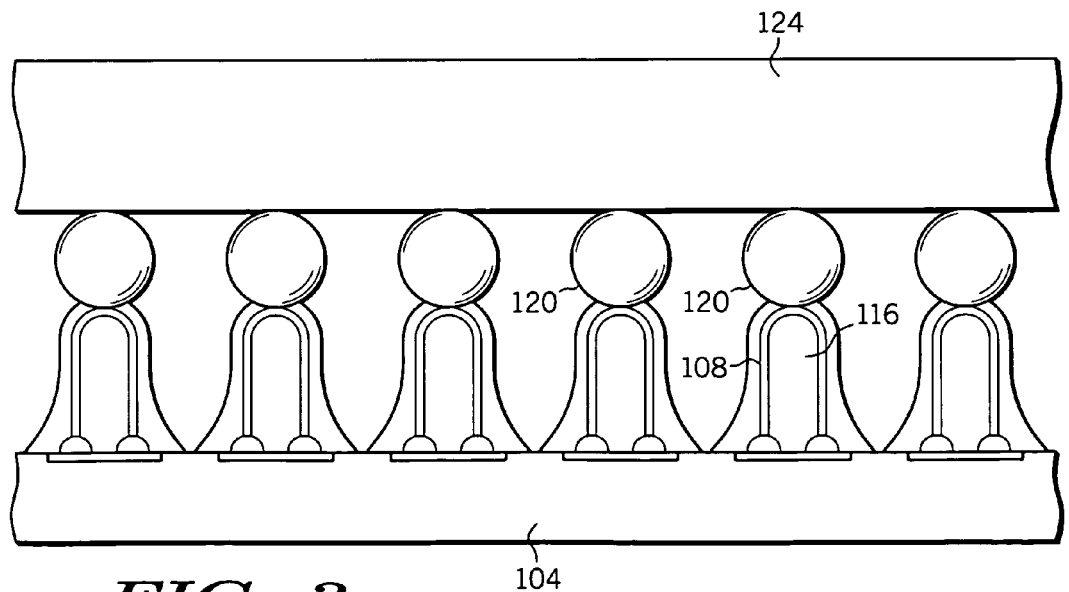
FIG. 3 illustrates an enlarged cross-sectional view of the semiconductor wafer of FIG. 2 receiving a solder source in accordance with an embodiment of the present invention.

Referring now to FIG. 3, an enlarged cross-sectional view of the substrate 104 receiving a solder source 120 in accordance with an embodiment of the present invention is shown. The solder source 120 is attached to or placed in contact with each support structure 108. The solder source 120 may be pre-attached to a semiconductor integrated circuit chip 124.

The solder source 120 may comprise a eutectic solder, for example, eutectic tin-lead solder (37% lead and 63% tin), or eutectic tin-silver-copper solder (96.5% tin, 3% silver and 0.5% copper), or high lead solder (95% lead and 5% tin). Alternatively, a lead-free solder could be used. Preferably, the solder source 120 has a melting point that is lower than a melting point of the support structure material so that the support structure 108 remains solid during reflow. The melting point for the solder may range between about 150 degrees Celsius to about 320 degrees Celsius.

Figure 4:
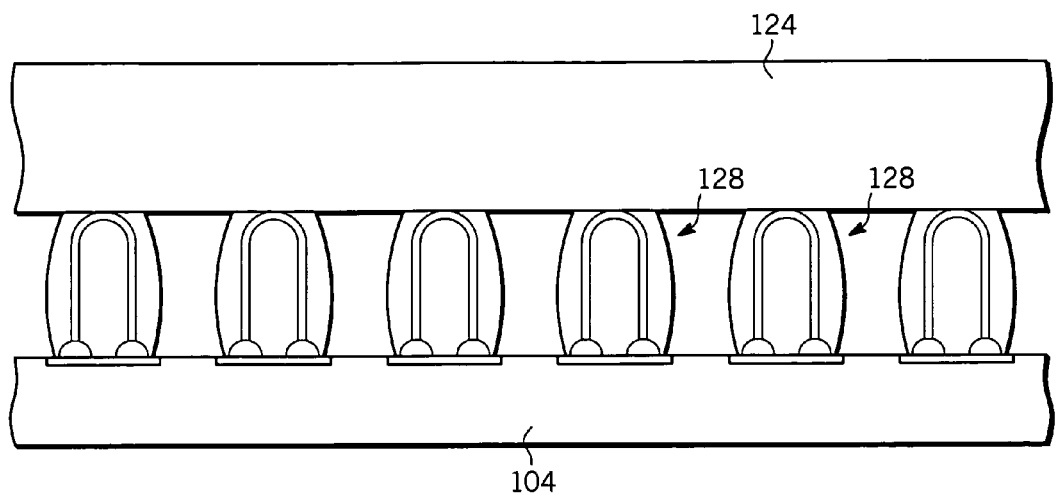
FIG. 4 illustrates an enlarged through view of bumps formed on the semiconductor wafer of FIG. 3 after solder reflow in accordance with an embodiment of the present invention.

A reflow process is carried out to form solder bumps or interconnects 128 as shown in FIG. 4. More particularly, the substrate 104 and semiconductor chip 124 are heated to melt the solder source 120. Temperatures suitable for the reflow process depend on the material of the solder source 120 and may range between about 150 degrees Celsius to about 320 degrees Celsius. During reflow, the solder source 120 becomes molten and fuses with the adhesive 116 and then encloses the support structure 108. Since the support structure 108 has a higher melting point than the solder 120, the support structure 108 remains solid throughout the reflow process.

The semiconductor chip 124 is brought towards the support structure 108 until the semiconductor chip 124 is juxtaposed with the support structure 108 to form an electrical connection between the chip 124 and the substrate 104. When the molten solder solidifies, an interconnect 128 is formed around the support structure 108. FIG. 4 illustrates an enlarged through view of interconnects 128 formed on the substrate 104 of FIG. 3 after solder reflow. It should be appreciated that one embodiment of the interconnects 128 is a substantially filled capsule, which is structurally reinforced by the support structure 108 for improving the mechanical strength of the interconnect 128.

Figure 5:
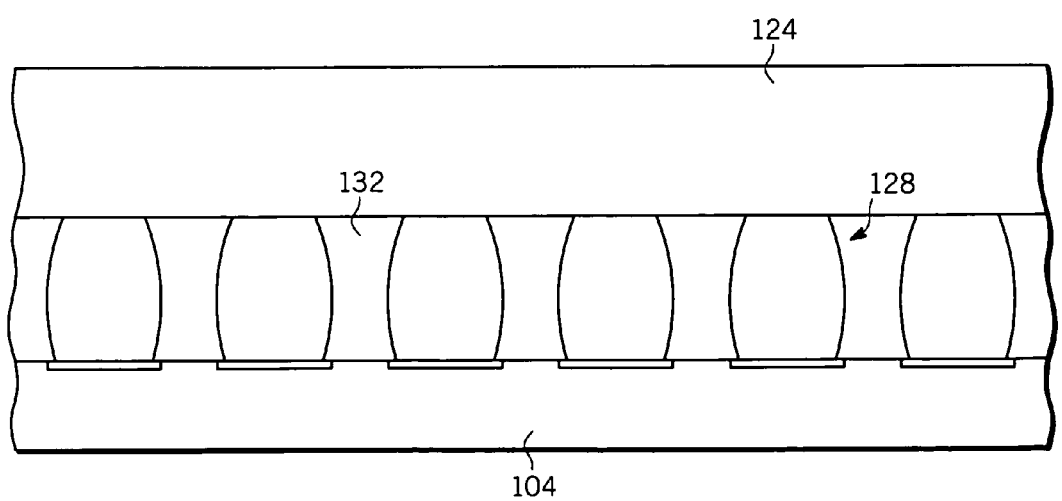
FIG. 5 illustrates an enlarged cross-sectional view of the semiconductor wafer of FIG. 4 receiving an underfill layer in accordance with an embodiment of the present invention.

Referring now to FIG. 5, an enlarged cross-sectional view of the substrate 104 of FIG. 4 receiving a dielectric material to form an underfill layer 132 in accordance with an embodiment of the present invention is shown. The dielectric material may be introduced between the semiconductor chip 124 and the substrate 104 to provide support and stability to the semiconductor chip 124 and the interconnect 128. Another purpose of the underfill layer 132 is to separate the interconnect 128 from an adjacent interconnect to prevent electrical shorting.

Instead of the configuration shown in FIG. 3, the solder source 120 may be a solder powder reservoir containing solder powder having a particle diameter of between about 5 microns to about 10 microns. While other particle sizes may also be used, it should be appreciated that larger particle sizes may result in larger interconnect sizes and pitch. The solder powder is deposited onto the support structure 108 and attaches top the adhesive 116 previously deposited onto the support structure 108 before the reflow. In such a case where solder powder is used, a further reflow may be required to electrically connect the semiconductor chip 124 to the substrate 104 through the interconnect 128.

Figure 6A:
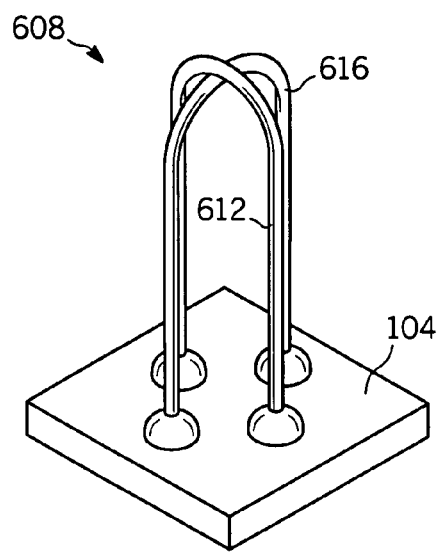
FIG. 6A illustrates an enlarged perspective view of a support structure formed on a semiconductor wafer in accordance with another embodiment of the present invention.

Referring now to FIG. 6A, an alternative configuration of a support structure 608 formed on a substrate 104 in accordance with another embodiment of the present invention is shown. A first wire to form a first loop 612 and a second wire to form a second loop 616 are bonded to the substrate 104 to form the support structure 608. The two loops 612, 616 preferably intersect each other to encompass a greater area therebetween relative to the single loop embodiment of FIG. 1. The double loop support structure 608 enables supports more solder material than the support structure 108 of FIG. 1, and is therefore suitable for forming interconnects with a larger cross-section. The first and second wire loops 608 and 612 are formed with a wire bonding machine. While any wire, such as copper or gold, may be used, it is preferred to use copper wire because of its high mechanical strength.

Figure 6B:
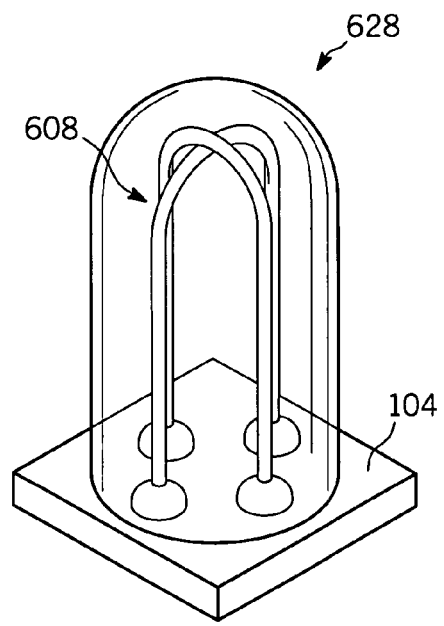
FIG. 6B illustrates an enlarged through view of an interconnect enclosing the support structure of FIG. 6A in accordance with an embodiment of the present invention.
Figure 6C:
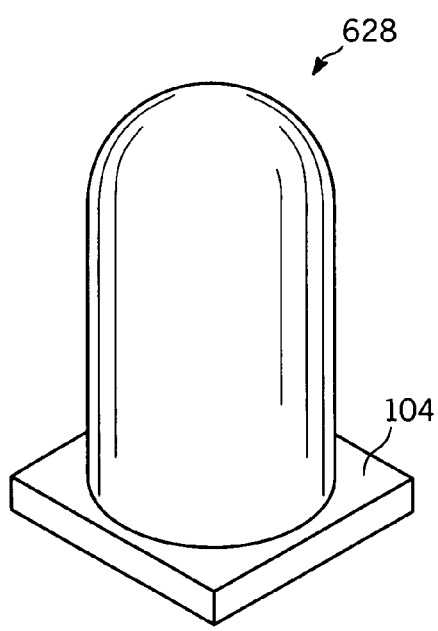
FIG. 6C illustrates an enlarged perspective view of the interconnect of FIG. 6B in accordance with an embodiment of the present invention.

FIG. 6B illustrates an enlarged through view of a solder bump or interconnect 628 formed by depositing solder over the support structure 608 of FIG. 6A. Similar to the interconnects 128 of FIG. 4, it should be appreciated that the interconnect 628 is a substantially filled capsule, which is structurally reinforced by the support structure 608. That is, the interconnect 628 is formed in the same manner as the interconnect 128 described above. FIG. 6C illustrates an enlarged perspective view of the interconnect 628.

One advantage of the present invention is that the aspect ratio of the interconnects can be increased. Conventional interconnects or bumps are typically spherical and therefore have an aspect ratio of only about one. While some interconnects may have aspect ratios greater than one, such interconnects are usually formed by coupling two or more elongated pillars and using chemical processes, both of which are more expensive.

In the present invention, an increased aspect ratio of greater than about 1.5 can be achieved without forming multiple interconnects or bumps. Since the size of bond pads are usually in the range of about 40 microns to about 100 microns and the stand-off height of the interconnect formed by the present invention may be between 150 microns to 300 microns, a much higher aspect ratio of greater than about 1.5 can be achieved by the present invention.

Another main advantage is the high stand-off that can be obtained by the present invention. Stand-off is dependent on the height of the support structure 108 or 608, which may be adjusted by varying the loop height. As such, height of the interconnect 128 or capsule may be as high as 150 microns to 300 microns depending on the capability of the wire bonding machine.

The high stand-off reduces thermal mechanical stresses caused by a coefficient of thermal expansion (CTE) mismatch in the packaging materials. Silicon typically has a CTE in the range of 2 to 4, while a circuit board has a CTE in the range of 12 to 18. The high stand-off of the present invention releases the stress due to the CTE mismatch and thereby improves joint reliability. In view of the foregoing CTE values (i.e. upper CTE of Si at 4 and lower CTE of a circuit board at 12), the present invention is suitable for devices with a CTE ratio between the circuit board and silicon of greater than about 3.

Another advantage of the present invention is that it reduces interconnect diameter and therefore provides a finer interconnect pitch without risking an electrical short. Conventional interconnects are typically spherical. Because the interconnects of the present invention are generally more elongated, a higher density of interconnects can be achieved without increasing the risk of having an interconnect coming into contact with an adjacent interconnect which would result in an electrical short.

Yet another advantage is that the present invention does not involve wet chemical processes, which are expensive and environmentally damaging. A further advantage is that mechanical strength of the interconnect is improved as a result of the reinforcement provided by the support structures 108, 608.

While the above processes are described in relation to forming interconnects or bumps on a semiconductor wafer, the present invention is also applicable to PCB substrates. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A method of forming an interconnect on a substrate comprising:
   forming a support structure on the substrate, wherein the support structure is formed by bonding first and second wire loops to the substrate, the first and second wire loops intersecting, and wherein each of the wire loops has have first and second ends that are bonded to the substrate and the intersection is at a midpoint of each of the wire loops at a location that is spaced from the substrate; and
   forming a capsule around the support structure to form the interconnect.

2. The method of forming the interconnect according to claim 1, wherein forming the capsule further comprises:
   depositing an adhesive on the support structure;
   depositing solder on the adhesive; and
   melting the solder to form the capsule.

3. The method of forming the interconnect according to claim 2, wherein a melting point of the support structure is higher than a melting point of the solder.

4. The method of forming the interconnect according to claim 2, wherein a height of the capsule is between about 150 microns to about 300 microns.

5. The method of forming the interconnect according to claim 2, wherein the solder is a powder having a particle size between about 5 microns to about 10 microns.

6. The method of forming the interconnect according to claim 2, wherein the solder is one of eutectic tin-lead solder, eutectic tin-silver-copper solder, and high lead solder.

7. The method of forming the interconnect according to claim 1, wherein the capsule has an aspect ratio of greater than about 1.5.

8. A method of forming a conductive bump, comprising:
   forming a support structure on a substrate, wherein the support structure comprises two intersecting wire loops formed by a wire bonding process, wherein each wire loop has first and second ends that are bonded to the substrate and the intersection is at a midpoint of the loops;
   depositing an adhesive on the support structure;
   depositing solder on the adhesive; and
   melting the solder to form the conductive bump.

9. The method of forming the conductive bump of claim 8, wherein the solder attaching step comprises dipping the support structure into molten solder.

* * * * *